(12) United States Patent
Park et al.

(10) Patent No.: US 10,593,378 B2
(45) Date of Patent: Mar. 17, 2020

(54) MEMORY DEVICE

(71) Applicant: SK hynix Inc., Gyeonggi-do (KR)

(72) Inventors: Myeong-Jae Park, Gyeonggi-do (KR); Young-Jae Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/152,549

(22) Filed: Oct. 5, 2018

(65) Prior Publication Data
US 2019/0279690 A1  Sep. 12, 2019

(30) Foreign Application Priority Data
Mar. 7, 2018 (KR) .......... 10-2018-0026779

(51) Int. Cl.
| | | |
|---|---|---|
| *G11C 7/10* | (2006.01) | |
| *H01L 25/18* | (2006.01) | |
| *H01L 25/065* | (2006.01) | |
| *G11C 5/06* | (2006.01) | |
| *G11C 5/04* | (2006.01) | |

(52) U.S. Cl.
CPC .......... *G11C 7/1048* (2013.01); *G11C 5/04* (2013.01); *G11C 5/063* (2013.01); *G11C 7/1006* (2013.01); *G11C 7/1012* (2013.01); *G11C 7/1078* (2013.01); *H01L 25/0657* (2013.01); *H01L 25/18* (2013.01); *G11C 7/1045* (2013.01); *G11C 2207/105* (2013.01); *H01L 2225/0652* (2013.01); *H01L 2225/06513* (2013.01); *H01L 2225/06517* (2013.01); *H01L 2225/06541* (2013.01); *H01L 2225/06565* (2013.01)

(58) Field of Classification Search
CPC ... G11C 7/1006; G11C 7/1012; G11C 7/1078; G11C 2207/105
See application file for complete search history.

(56) References Cited

U.S. PATENT DOCUMENTS

| | | | | |
|---|---|---|---|---|
| 2007/0165439 | A1* | 7/2007 | Schnell | .............. G11C 5/025 365/63 |
| 2009/0193316 | A1* | 7/2009 | Tayler | .............. G06F 11/1044 714/763 |
| 2016/0335158 | A1* | 11/2016 | De Schrijver | ...... G06F 11/1076 |

FOREIGN PATENT DOCUMENTS

| | | |
|---|---|---|
| KR | 1020050074246 | 7/2005 |
| KR | 100564469 | 3/2006 |

* cited by examiner

*Primary Examiner* — Uyen B Tran
(74) *Attorney, Agent, or Firm* — IP & T Group LLP

(57) ABSTRACT

A memory device includes: a plurality of data pads; a data distribution circuit suitable for distributing data received through some data pads of the plurality of data pads to a first data bus, and distributing data received through the other data pads to a second data bus, in a first mode; a first channel region suitable for storing data obtained by copying the data of the first data bus at a predetermined ratio of 1:N where N is an integer equal to or more than 2; and a second channel region suitable for storing data obtained by copying the data of the second data bus at the predetermined ratio of 1:N.

17 Claims, 5 Drawing Sheets

MEMORY DEVICE

CROSS-REFERENCE TO RELATED APPLICATION

This application claims priority under 35 U.S.C. § 119(a) to Korean Patent Application No. 10-2018-0026779 filed on Mar. 7, 2018, which is incorporated herein by reference in its entirety.

BACKGROUND

1. Field

This patent document relates to a memory device and a memory system including the same.

2. Discussion of the Related Art

With the rapid development of the semiconductor memory technology, the packaging technology for a semiconductor device has gradually required high integration and high performance. Therefore, a variety of techniques for a three-dimensional (3D) structure have been developed in place of a two-dimensional (2D) structure. In accordance with the 2D structure, a plurality of integrated circuit chips is two-dimensionally arranged on a printed circuit board (PCB) through wires or bumps. In accordance with the 3D structure, a plurality of integrated circuit chips is vertically stacked.

Such a 3D structure may be implemented through a stacked memory device in which a plurality of memory chips are vertically stacked. The memory chips stacked in the vertical direction are mounted on a substrate for a semiconductor package while being electrically coupled to each other through through-silicon vias (TSVs).

SUMMARY

Various embodiments are directed to a technology capable of increasing test efficiency of a memory device.

In an embodiment, a memory device may include: a plurality of data pads; a data distribution circuit suitable for distributing data received through some data pads of the plurality of data pads to a first data bus, and distributing data received through the other data pads to a second data bus, in a first mode; a first channel region suitable for storing data obtained by copying the data of the first data bus at a predetermined ratio of 1:N where N is an integer equal to or more than 2; and a second channel region suitable for storing data obtained by copying the data of the second data bus at the predetermined ratio of 1:N.

In an embodiment, a high bandwidth memory (HBM) device may include: a direct access (DA) interface comprising a plurality of data pads; a data distribution circuit suitable for distributing data received through some data pads of the plurality of data pads to an A data bus, and distributing data received through the other data pads to a B data bus, in a first mode; and first to Mth channel regions, wherein each of the first to Mth channel regions comprises: a pseudo A channel region suitable for storing data obtained by copying the data of the A data bus at a predetermined ratio of 1:N where N is an integer equal to or more than 2; and a pseudo B channel region suitable for storing data obtained by copying the data of the B data bus at the predetermined ratio of 1:N.

In an embodiment, a memory device may include: an interface including a data pad configured to receive first data having a first size; a plurality of channel regions, each channel region including a first region and a second region configured to store second data having a second size greater than the first size; a data distribution circuit configured to receive the first data from the interface, and transfer the first data or the inverted first data as a first bus data and a second bus data to a first data bus and a second data bus, respectively; a first copy circuit configured to receive and copy the first bus data to output the copied first bus data to the first region of each of the plurality of channel regions; and a second copy circuit configured to receive and copy the second bus data to output the copied second bus data to the second region of each of the plurality of channel regions

DETAILED DESCRIPTION

Figure 1:
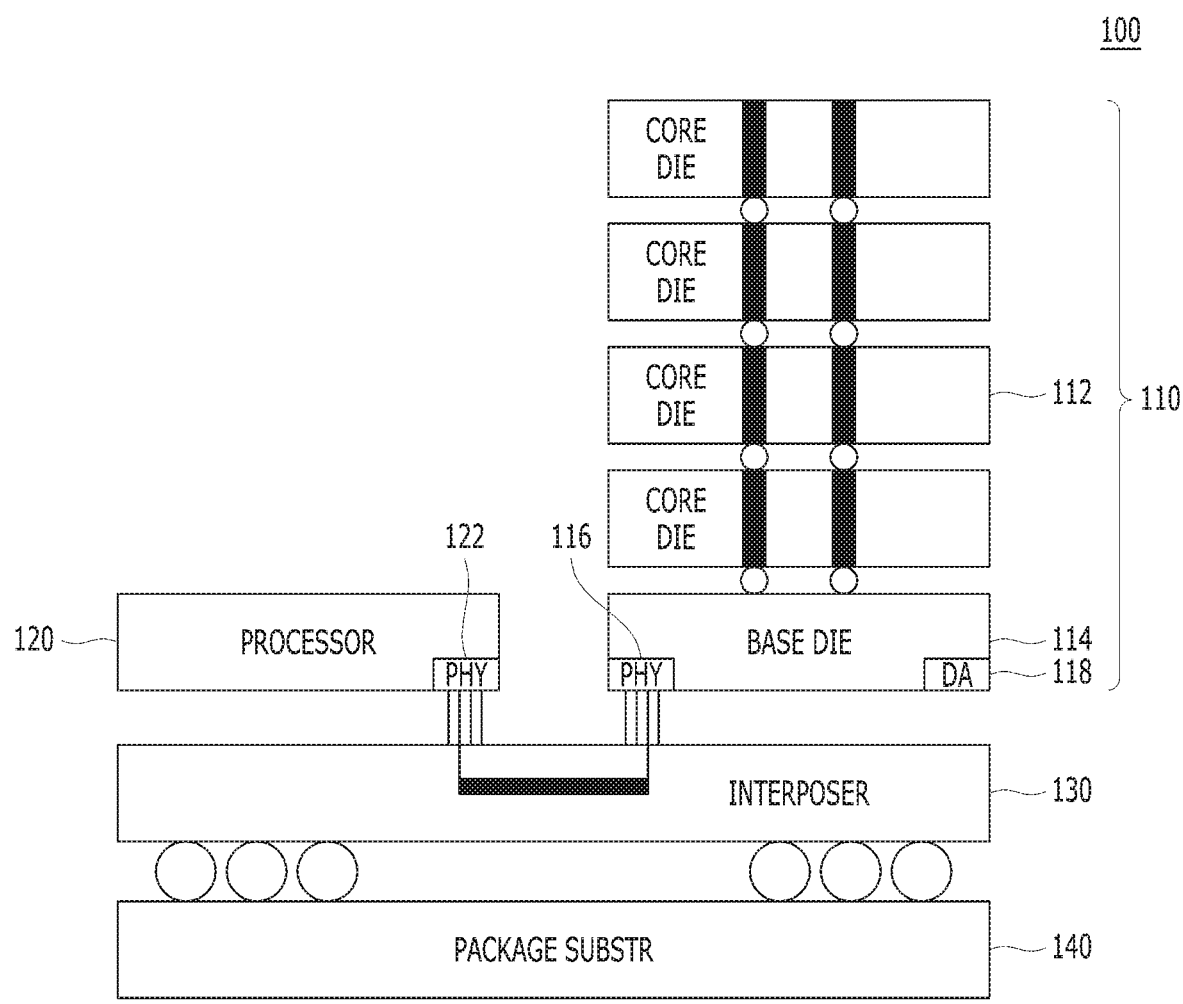
FIG. 1 illustrates a configuration of a memory system in accordance with an embodiment.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 illustrates the configuration of a memory system 100 in accordance with an embodiment.

Referring to FIG. 1, the memory system 100 may include a memory device 110, a memory controller 120, an interposer 130 and a package substrate 140.

The interposer 130 may be formed over the package substrate 140. The memory device 110 and the memory controller 120 may be formed over the interposer 130. Since the memory controller 120 is generally included in various processors such as a central processing unit (CPU), graphic processing unit (GPU) and application processor (AP), the memory controller 120 is represented by PROCESSOR in FIG. 1. A physical (PHY) interface 116 of the memory device 110 and a physical (PHY) interface 122 of the memory controller 120 may be coupled through the interposer 130. The PHY interface 116 may serve as an interface for communication between the memory device 110 and the memory controller 120.

The memory device 110 may include a plurality of integrated circuit chips stacked therein. The plurality of integrated circuit chips may be electrically coupled to each other through through-silicon vias (TSVs). The plurality of integrated circuit chips may include a base die 114 and a plurality of core dies 112. Each of the core dies 112 may include a cell array for storing data and circuits for writing and reading data to/from the cell array. The base die 114 may include circuits for interfacing the core dies 112 and the base die 114 and circuits for interfacing the base die 114 and the memory controller 120. When the memory device 110 is configured in the above-described manner, the number of data input/output units may be significantly increased, which makes it possible to increase a bandwidth. Examples of the memory device 110 having such a configuration may include a high bandwidth memory (HBM) adopted by Joint Electron Device Engineering Council (JEDEC) as an industry standard. The HBM may include various versions of HBMs such as HBM2 and HBM3 as well as HBM1.

The PHY interface 116 may serve as an interface for communication between the base die 114 and the memory controller 120. A direct access (DA) interface 118 may serve as an interface for a test of the memory device 110. The PHY interface 116 may be coupled to the interposer 130 through micro bumps. The micro bumps may have a small physical size and the number of micro bumps may be equal to or more than 1,000. Thus, it is generally very difficult to test the memory device 110 using the PHY interface 116. For this reason, the DA interface 118 interfaced through one or more DA pads may be used for a test of the memory device 110. The one or more DA pads may each have a larger physical size than the micro bumps. The one or more DA pads may be fewer than the micro bumps.

In a normal mode of operation, the memory device 110 may operate using the PHY interface 116. The normal mode of operation may also be referred to as a mission mode. In a test mode of operation, the memory device 110 may operate using the DA interface 118. The test mode of operation may also be referred to as a direct access (DA) mode.

Figure 2:
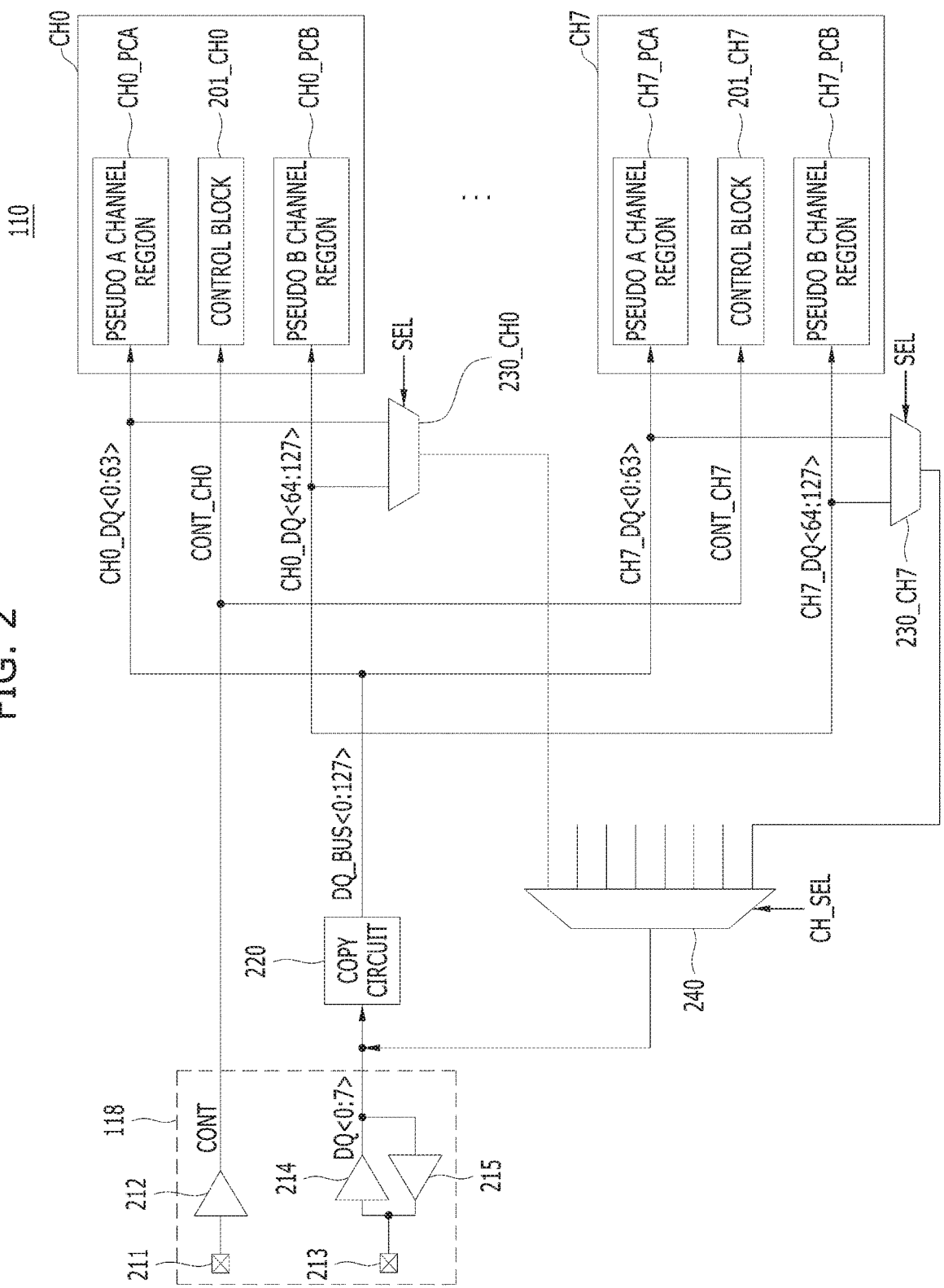
FIG. 2 is a configuration diagram illustrating an example of a memory device in accordance with an embodiment.

FIG. 2 illustrates an example of a memory device in accordance with an embodiment. The memory device illustrated in FIG. 2 may be the memory device 110 of the memory system of FIG. 1. It is noted that FIG. 2 illustrates components related to the direct DA mode operation in the memory device 110.

Referring to FIG. 2, the memory device 110 may include first to eighth channel regions CH0 to CH7, a DA interface 118, a copy circuit 220, first selection circuits 230_CH0 to 230_CH7, and a second selection circuit 240. The DA interface 118, the copy circuit 220, the first selection circuits 230_CH0 to 230_CH7 and the second selection circuit 240 may be included in the base die 114 of FIG. 1. The first to eighth channel regions CH0 to CH7 may be included in the core dies 112 of FIG. 1. For example, each of the four core dies 112 may include two channel regions.

The first to eighth channel regions CH0 to CH7 may be individually controlled by control signals CONT_CH0 to CONT_CH7 for the respective channel regions CH0 to CH7, and transmit and receive individual data CH0_DQ<0:127> to CH7_DQ<0:127>. The first to eighth channel regions CH0 to CH7 may perform different operations at the same time. For example, while a read operation is performed in the second channel region CH1, a write operation may be performed in the sixth channel region CH5, and an active operation may be performed in the eighth channel region CH7. During the mission mode, the first to eighth channel regions CH0 to CH7 may be controlled by the independent control signals CONT_CH0 to CONT_CH7 for the respective channel regions, and transmit and receive the independent data CH0_DQ<0:127> to CH7_DQ<0:127> for the respective channel regions. During the DA mode, the same control signals may be transferred to the first to eighth channel regions CH0 to CH7, and the first to eighth channel regions CH0 to CH7 may transmit and receive the same data, due to interface restrictions. That is, during the DA mode, the first to eighth channel regions CH0 to CH7 are provided with the same control signals as CONT_CH0=CONT_CH1= . . . =CONT_CH7, and the first to eighth channel regions CH0 to CH7 transmit and receive the same data as CH0_DQ<0:127>=CH1_DQ<0:127>= . . . =CH7_DQ<0:127>.

The first to eighth channel regions CH0 to CH7 may include pseudo A channel regions CH0_PCA to CH7_PCA and pseudo B channel regions CH0_PCB to CH7_PCB, respectively. The pseudo A channel regions CH0_PCA to CH7_PCA and the pseudo B channel regions CH0_PCB to CH7_PCB may be controlled by the same control signals CONT_CH0 to CONT_CH7, but transmit and receive different data. For example, the pseudo A channel region CH0_PCA and the pseudo B channel region CH0_PCB of the first channel region CH0 may be controlled by the same control signal CONT_CH0, but transmit and receive different data CH0_DQ<0:63> and CH0_DQ<64:127>. The first to eighth channel regions CH0 to CH7 may include control blocks 201_CH0 to 201_CH7. The control blocks 201_CH0 to 201_CH7 may receive the control signals CONT_CH0 to CONT_CH7 for the corresponding channel regions, and control the pseudo A channel regions CH0_PCA to CH7_PCA and the pseudo B channel regions CH0_PCB to CH7_PCB, respectively.

The DA interface 118 may include a plurality of control pads 211, a plurality of control signal receivers 212, a plurality of data pads 213, a plurality of data receivers 214 and a plurality of data transmitters 215.

The plurality of control signal receivers 212 may receive control signals CONT from the plurality of control pads 211. The control signals CONT may include CA<0:7>, RA<0:5>, CKE, CKt and CKc. Here, CA<0:7> may represent eight signals including a column command and column address, RA<0:5> may represent six signals including a row command and row address, CKE may represent a clock enable signal, and CKt and CKc may represent clock signals which are inputted in a differential manner. For convenience, FIG. 2 illustrates one control pad and one control signal receiver. However, the number of control pads and control signal receivers may be equal to the number of control signals CONT.

The plurality of data receivers 214 may receive data DQ<0:7> from the plurality of data pads 213. The plurality of data transmitters 215 may transmit the data DQ<0:7> to the plurality of data pads 213. For convenience, FIG. 2 illustrates one data pad one data receiver, and one data transmitter.

The control signals CONT received by the plurality of control signal receivers 212 of the DA interface 118 may be transmitted to the first to eighth channel regions CH0 to CH7 in common. That is, the control signals CONT_CH0 to CONT_CH7 of the first to eighth channel regions CH0 to CH7 may be the same: CONT=CONT_CH0=CONT_CH1= . . . =CONT_CH7. That is because, since the numbers of the control pads 211 and the control signal receivers 212 which are included in DA interface 118 are small, it is impossible to apply different control signals to the first to eighth channel regions CH0 to CH7. In the mission mode using the PHY interface 116, the control signals CONT_CH0 to CONT_CH7 of the first to eighth channel regions CH0 to CH7 may be independent of each other.

The data DQ<0:7> received by the plurality of data receivers 214 of the DA interface 118 may be transferred to the copy circuit 220. The data DQ<0:7> may be copied at a predetermined ratio (e.g., 1:16). While the number of lines included in each of the data buses CH0_DQ<0:127> to CH7_DQ<0:127> of the first to eighth channel regions CH0 to CH7 is 128, the numbers of the data pads 213 and the data receivers 214 in the DA interface 118 are only 8. Therefore, the data DQ<0:7> may be copied at 1:16, and transferred to the data bus DQ_BUS<0:127>. At this time, the data DQ<0:7> may be copied in such a manner that the following relation is established: DQ_BUS<0:7>=DQ<0:7>, DQ_BUS<8:15>=DQ<0:7>, . . . , DQ_BUS<120:127>=DQ<0:7>. The data of the data bus DQ_BUS<0:127> may be transferred to the data buses CH0_DQ<0:127> to CH7_DQ<0:127> of the first to eighth channel regions CH0 to CH7 in common. That is, the following relation is established between the data bus DQ_BUS<0:127> and the data buses CH0_DQ<0:127> to CH7_DQ<0:127> of the first to eighth channel regions CH0 to CH7: DQ_BUS<0:127>=CH0_DQ<0:127>, DQ_BUS<0:127>=CH1_DQ<0:127>, . . . , DQ_BUS<0:127>=CH7_DQ<0:127>.

The first selection circuits 230_CH0 to 230_CH7 may select data to be outputted through the DA interface 118, among the data CH0_DQ<0:127> to CH7_DQ<0:127> of the corresponding channels, in response to a select signal SEL. That is, each of the first selection circuits 230_CH0 to 230_CH7 may select eight data which may be outputted through the DA interface 118, among the 128 data of the corresponding channel. The second selection circuit 240 may select one of the outputs of the first selection circuits 230_CH0 to 230_CH7 in response to a channel select signal CH_SEL. The data selected by the second selection circuit 240 may be finally transferred to the plurality of data transmitters 215 of the DA interface 118, and outputted through the plurality of data pads 213. The select signal SEL and the channel select signal CH_SEL may include multiple bits. Eight data of 128 data within the corresponding channel may be selected by the select signal SEL, and one channel of the eight channels may be selected by the channel select signal CH_SEL. As a result, the eight data selected by the select signal SEL at the channel selected by the channel select signal CH_SEL may be outputted by the plurality of data transmitters 215 of the DA interface 118. The first selection circuits 230_CH0 to 230_CH7 and the second selection circuit 240 may be used during a read operation.

Figure 3:
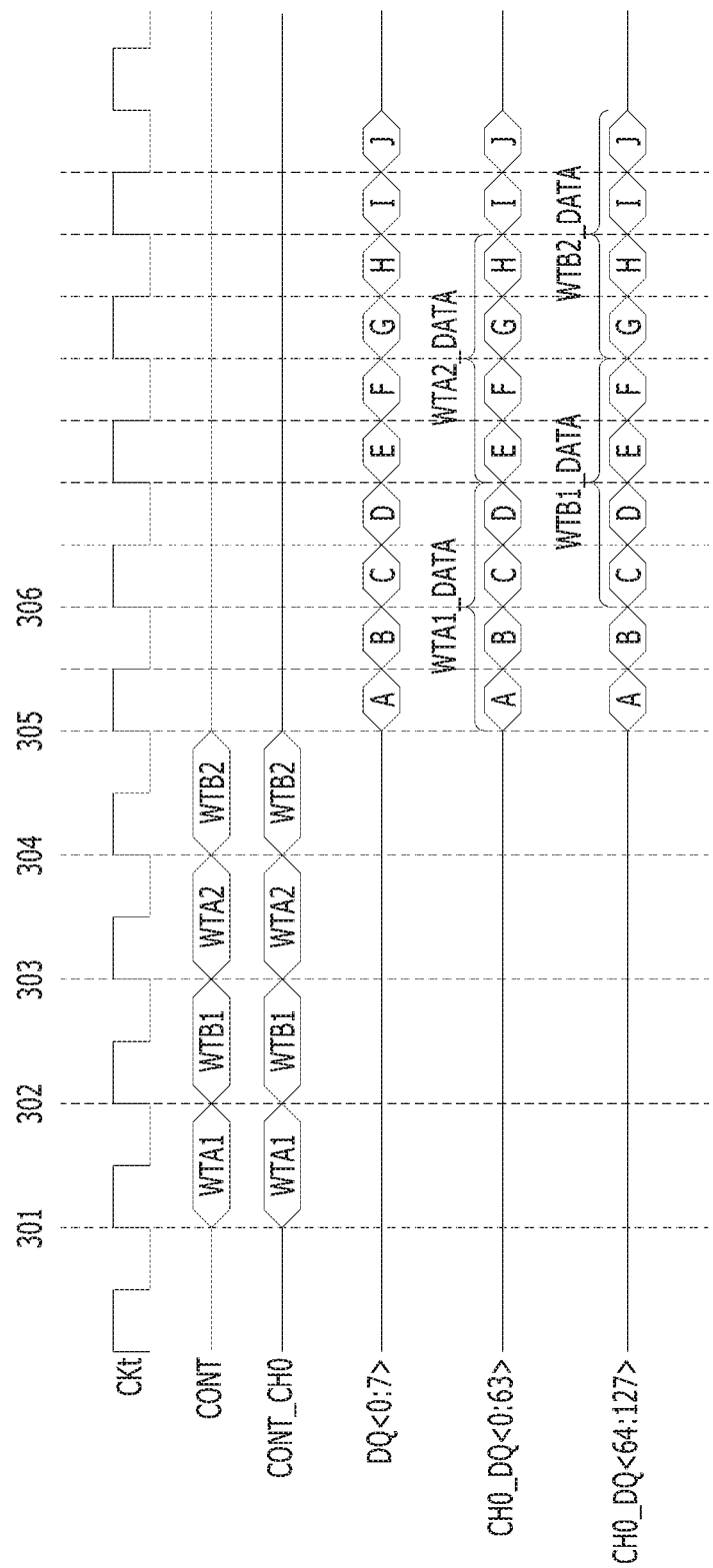
FIG. 3 illustrates a direct access (DA) mode operation of a memory device in accordance with an embodiment.

FIG. 3 illustrates a direct access (DA) mode operation of a memory device in accordance with an embodiment, for example, the DA mode operation of the memory device 110 of FIG. 2. It is noted that FIG. 3 illustrates the operation of the first channel region CH0 of the memory device 110. Hereafter, it is supposed that write latency (WL) in the memory device 110 is set to 4, and a burst length (BL) of data is set to 4.

Referring to FIG. 3, the control signals CONT received through the DA interface 118 are equal to the control signals CONT_CH0 of the first channel region CH0. Since the data DQ<0:7> received through the DA interface 118 are copied at a predetermined ratio (e.g., 1:16) and transferred to the data bus CH0_DQ<0:127> of the first channel region CH0, a relation of DQ<0:7>=CH0_DQ<0:63>=CH0_DQ<64:127> may be established.

A write command WTA1 indicating a write operation of the pseudo A channel region CH0_PCA may be applied by the control signals CONT_CH0 at time point 301. A write command WTB1 indicating a write operation of the pseudo B channel region CH0_PCB may be applied by the control signals CONT_CH0 at time point 302. A write command WTA2 indicating a write operation of the pseudo A channel region CH0_PCA may be applied at time point 303. A write command WTB2 indicating a write operation of the pseudo B channel region CH0_PCB may be applied at time point 304.

Data A, B, C and D corresponding to the write command WTA1 may be received through the DA interface 118 at time point 305 after the write latency WL from time point 301. Since the data DQ<0:7> are repeatedly copied at 1:16 into the data bus CH0_DQ<0:127> of the first channel region CH0, the same data A, B, C and D may be repeatedly copied at 1:8 and transferred to the data bus CH0_DQ<0:63> of the pseudo A channel region CH0_PCA, and repeatedly written at 1:8 to the pseudo A channel region CH0_PCA. In FIG. 3, the data A, B, C and D written to the pseudo A channel region CH0_PCA by the write command WTA1 is represented by WTA1_DATA.

At time point 306 after the write latency WL from time point 302, data C, D, E and F corresponding to the write command WTB1 may be received through the DA interface 118. Furthermore, the same data C, D, E and F may be repeatedly transferred at 1:8 to the data bus CH0_DQ<64:127> of the pseudo B channel region CH0_PCB, and repeatedly written at 1:8 to the pseudo B channel region CH0_PCB. In FIG. 3, the data C, D, E and F written to the pseudo B channel region CH0_PCB by the write command WTB1 are represented by WTB1_DATA.

Similarly, data E, F, G and H corresponding to the write command WTA2 may be written to the pseudo A channel region CH0_PCA, and represented by WTA2_DATA. Furthermore, data G, H, I and J corresponding to the write command WTB2 may be written to the pseudo B channel region CH0_PCB, and represented by WTB2_DATA.

As illustrated in FIG. 3, it is impossible to apply data having different patterns to the data bus CH0_DQ<0:63> of the pseudo A channel region CH0_PCA and the data bus CH0_DQ<64:127> of the pseudo B channel region CH0_PCB, when the DA interface 118 is used. Therefore, the data written to the pseudo A channel region CH0_PCA cannot have a different pattern from the data written to the pseudo B channel region CH0_PCB. For example, the data WTA1_DATA and WTB1_DATA may include in common the data C and D, the data WTB1_DATA and WTA2_DATA may include in common the data E and F, and the data WTA2_DATA and WTB2_DATA may include in common the data G and H.

Figure 4:
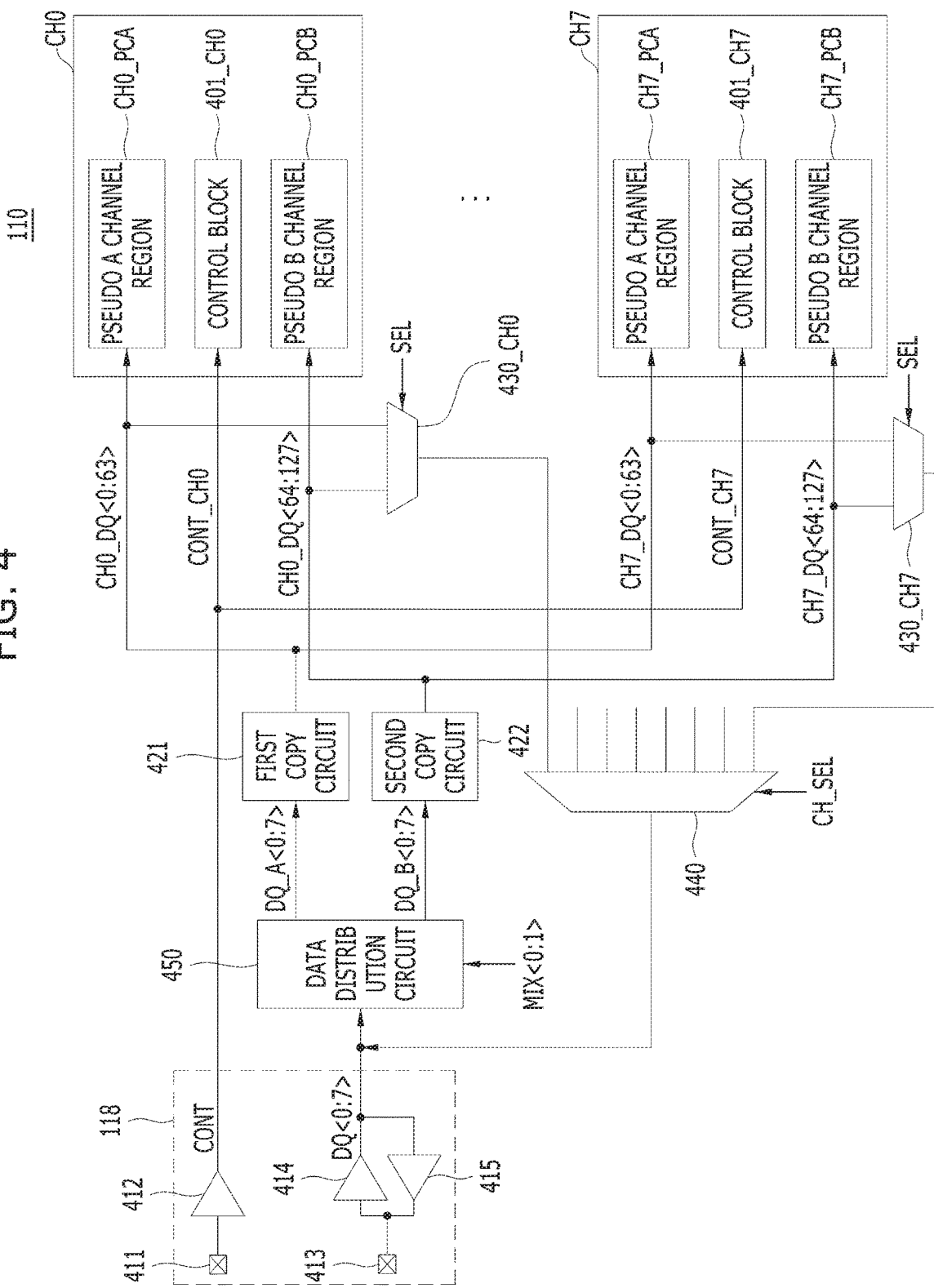
FIG. 4 is a diagram illustrating another example of a memory device in accordance with an embodiment.

FIG. 4 illustrates another example of a memory device in accordance with an embodiment, for example, the memory device 110 of FIG. 1. It is noted that FIG. 4 illustrates components related to the direct access (DA) mode operation in the memory device 110.

Referring to FIG. 4, the memory device 110 may include first to eighth channel regions CH0 to CH7, a direct access (DA) interface 118, a data distribution circuit 450, a first copy circuit 421, a second copy circuit 422, first selection circuits 430_CH0 to 430_CH7 and a second selection circuit 440. The DA interface 118, the data distribution circuit 450, the first copy circuit 421, the second copy circuit 422, the first selection circuits 430_CH0 to 430_CH7 and the second selection circuit 440 may be included in the base die 114 of FIG. 1. The first to eighth channel regions CH0 to CH7 may be included in the core dies 112 of FIG. 1. For example, each of the four core dies 112 may include two channel regions.

The first to eighth channel regions CH0 to CH7 may be controlled by individual control signals CONT_CH0 to CONT_CH7 for the respective channel regions, and transmit and receive individual data CH0_DQ<0:127> to CH7_DQ<0:127>. The first to eighth channel regions CH0 to CH7 may perform different operations at the same time.

For example, while a read operation is performed in the second channel region CH1, a write operation may be performed in the sixth channel region CH5, and an active operation may be performed in the eighth channel region CH7. During the mission mode, the first to eighth channel regions CH0 to CH7 may be controlled by the independent control signals CONT_CH0 to CONT_CH7 for the respective channel regions, and transmit and receive independent data CH0_DQ<0:127> to CH7_DQ<0:127> for the respective channel regions. During the DA mode, the same control signals may be transferred to the first to eighth channel regions CH0 to CH7, and the first to eighth channel regions CH0 to CH7 may transmit and receive the same data, due to interface restrictions. That is, during the DA mode, the first to eighth channel regions CH0 to CH7 are provided with the same control signals as CONT_CH0=CONT_CH1= . . . =CONT_CH7, and the first to eighth channel regions CH0 to CH7 transmit and receive the same data as CH0_DQ<0:127>=CH1_DQ<0:127>= . . . =CH7_DQ<0:127>.

The first to eighth channel regions CH0 to CH7 may include pseudo A channel regions CH0_PCA to CH7_PCA and pseudo B channel regions CH0_PCB to CH7_PCB, respectively. The pseudo A channel regions CH0_PCA to CH7_PCA and the pseudo B channel regions CH0_PCB to CH7_PCB may be controlled by the same control signals CONT_CH0 to CONT_CH7, but transmit and receive different data CH0_DQ<0:63> and CH0_DQ<64:127>. For example, the pseudo A channel region CH0_PCA and the pseudo B channel region CH0_PCB of the first channel region CH0 may be controlled by the same control signals CONT_CH0, but transmit and receive different data CH0_DQ<0:63> and CH0_DQ<64:127>. The first to eighth channel regions CH0 to CH7 may include control blocks 401_CH0 to 401_CH7. The control blocks 401_CH0 to 401_CH7 may receive the control signals CONT_CH0 to CONT_CH7 of the corresponding channel regions, and control the pseudo A channel regions CH0_PCA to CH7_PCA and the pseudo B channel regions CH0_PCB to CH7_PCB, respectively.

The DA interface 118 may include a plurality of control pads 411, a plurality of control signal receivers 412, a plurality of data pads 413, a plurality of data receivers 414 and a plurality of data transmitters 415.

The plurality of control signal receivers 412 may receive control signals CONT from the plurality of control pads 411. The control signals CONT may include CA<0:7>, RA<0:5>, CKE, CKt and CKc. Here, CA<0:7> may represent eight signals including a column command and column address, RA<0:5> may represent six signals including a row command and row address, CKE may represent a clock enable signal, and CKt and CKc may represent clock signals which are inputted in a differential manner. For convenience, FIG. 4 illustrates one control pad and one control signal receiver. However, the number of control pads and control signal receives may be equal to the number of control signals CONT.

The plurality of data receivers 414 may receive data DQ<0:7> from the plurality of data pads 413. The plurality of data transmitters 415 may transmit the data DQ<0:7> to the plurality of data pads 413. For convenience, FIG. 4 illustrates one data pad one data receiver, and one data transmitter.

The control signals CONT received by the plurality of control signal receivers 412 of the DA interface 118 may be transferred to the first to eighth channel regions CH0 to CH7 in common. That is, the control signals CONT_CH0 to CONT_CH7 of the first to eighth channel regions CH0 to CH7 may be the same: CONT=CONT_CH0=CONT_CH1= . . . =CONT_CH7. That is because, since the numbers of the control pads 411 and the control signal receivers 412 included in the DA interface 118 are small, it is impossible to apply different control signals to the first to eighth channel regions CH0 to CH7. In the mission mode using the PHY interface 116, the control signals CONT_CH0 to CONT_CH7 of the first to eighth channel regions CH0 to CH7 may be independent of each other.

The data DQ<0:7> received by the plurality of data receivers 414 of the DA interface 118 may be transferred to the data distribution circuit 450. The data distribution circuit 450 may distribute the data DQ<0:7> to the first data bus DQ_A<0:7> and the second data bus DQ_B<0:7> according to first to fourth modes indicated by a mix signal MIX<0:1>. Table 1 below indicates how the data DQ<0:7> are distributed to the first data bus DQ_A<0:7> and the second data bus DQ_B<0:7> according to the modes.

TABLE 1

|  | First mode MIX<0:1> = 0.0 | Second mode MIX<0:1> = 0.1 | Third mode MIX<0:1> = 1.0 | Fourth mode MIX<0:1> = 1.1 |
| --- | --- | --- | --- | --- |
| DQ_A<0:3> | DQ<0:3> | DQ<0:3> | DQ<0:3> | DQ<0:3> |
| DQ_A<4:7> | DQ<0:3> | DQ<4:7> | /DQ<0:3> | DQ<4:7> |
| DQ_B<0:3> | DQ<4:7> | DQ<0:3> | DQ<4:7> | /DQ<0:3> |
| DQ_B<4:7> | DQ<4:7> | DQ<4:7> | /DQ<4:7> | /DQ<4:7> |

Referring to Table 1, in the first mode in which the mix signal MIX<0:1> is a value of (0, 0), the data DQ<0:3> may be copied at a predetermined ratio (e.g., 1:2) and transferred to the first data bus DQ_A<0:7>, and the data DQ<4:7> may be copied at the predetermined ratio (e.g., 1:2) and transferred to the second data bus DQ_B<0:7>.

In the second mode in which the mix signal MIX<0:1> is a value of (0, 1), the data DQ<0:7> may be transferred to the first data bus DQ_A<0:7> and the second data bus DQ_B<0:7>. That is, the following relation is established: DQ<0:7>=DQ_A<0:7>=DQ_B<0:7>.

In the third mode in which the mix signal MIX<0:1> is a value of (1, 0), the data DQ<0:3> may be transferred to the first data bus DQ_A<0:3>, and the data DQ<0:3> may be inverted and transferred to the first data bus DQ_A<4:7>. Furthermore, the data DQ<4:7> may be transferred to the second data bus DQ_B<0:3>, and the data DQ<4:7> may be inverted and transferred to the second data bus DQ_B<4:7>. In Table 1, symbol "/" represents inverted data.

In the fourth mode in which the mix signal MIX<0:1> is a value of (1, 1), the data DQ<0:7> may be transferred to the first data bus DQ_A<0:7>, and the data DQ<0:7> may be inverted and transferred to the second data bus DQ_B<0:7>.

The first copy circuit 421 may copy the data of the first data bus DQ_A<0:7> at a predetermined ratio (e.g., 1:8), and transfer the copied data to the data buses CH0_DQ<0:63> to CH7_DQ<0:63> of the first to eighth channel regions CH0 to CH7. The second copy circuit 422 may copy the data of the second data bus DQ_B<0:7> at a predetermined ratio (e.g., 1:8), and transfer the copied data to the data buses CH0_DQ<64:127> to CH7_DQ<64:127> of the first to eighth channel regions CH0 to CH7. That is, the data of the first data bus DQ_A<0:7> may be copied by the first copy circuit 421, and transferred to the pseudo A channel regions CH0_PCA to CH7_PCA within the first to eighth channel regions CH0 to CH7. The data of the second data bus DQ_B<0:7> may be copied by the second copy circuit 422, and transferred to the pseudo B channel regions CH0_PCB to CH7_PCB within the first to eighth channel regions CH0 to CH7.

The first selection circuits 430_CH0 to 430_CH7 may select data to be outputted through the DA interface 118, among the data CH0_DQ<0:127> to CH7_DQ<0:127> of the corresponding channels, in response to a select signal SEL. That is, each of the first selection circuits 430_CH0 to 430_CH7 may select eight data which may be outputted to the DA interface 118, among the 128 data of the corresponding channel. The second selection circuit 440 may select one of the outputs of the first selection circuits 430_CH0 to 430_CH7 in response to a channel select signal CH_SEL. The data selected by the second selection circuit 440 may be finally transferred to the plurality of data transmitters 415 of the DA interface 118, and outputted through the plurality of data pads 413. The select signal SEL and the channel select signal CH_SEL may include multiple bits. Eight data of the 128 data within the corresponding channel may be selected by the select signal SEL, and one channel of the eight channels may be selected by the channel select signal CH_SEL. As a result, the eight data selected by the select signal SEL at the channel selected by the channel select signal CH_SEL may be outputted by the plurality of data transmitters 415 of the DA interface 118. The first selection circuits 430_CH0 to 430_CH7 and the second selection circuit 440 may be used during a write operation.

In the embodiment of FIG. 4, different data may be transferred to the pseudo A channel regions CH0_PCA to CH7_PCA and the pseudo B channel regions CH0_PCB to CH7_PCB through the data distribution circuit 450. Therefore, even in the DA mode, desired data may be written to the pseudo A channel regions CH0_PCA to CH7_PCA and the pseudo B channel regions CH0_PCB to CH7_PCB.

Figure 5:
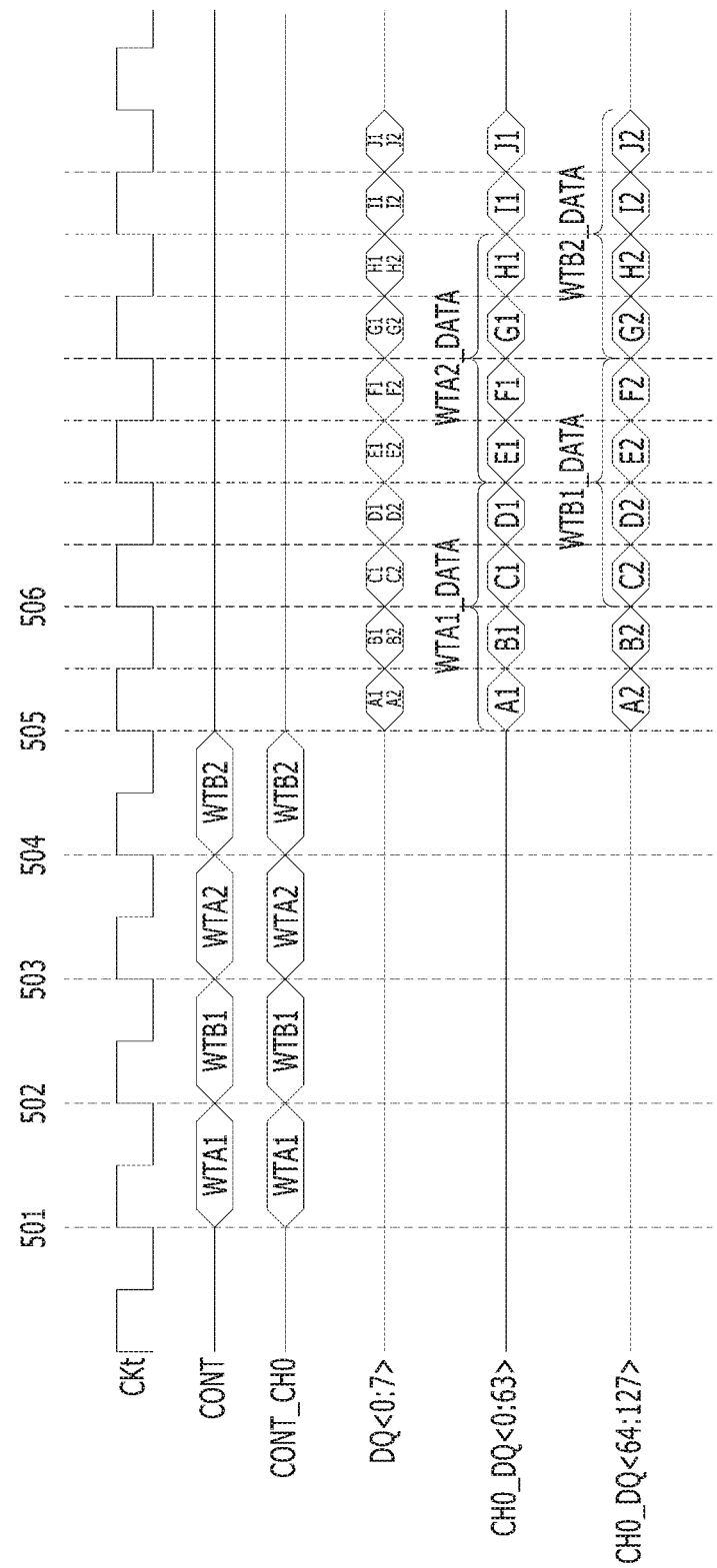
FIG. 5 illustrates a direct access (DA) mode operation of a memory device in accordance with an embodiment.

FIG. 5 illustrates a direct access (DA) mode operation of a memory device in accordance with an embodiment, for example, the DA mode operation of the memory device 110 of FIG. 4. It is noted that FIG. 5 illustrates the operation of the first channel region CH0 of the memory device 110. Hereafter, it is supposed that write latency (WL) in the memory device 110 is set to 4, and a burst length (BL) of data is set to 4. Furthermore, it is supposed that the data distribution circuit 450 operates in the first mode.

Referring to FIG. 5, the control signals CONT received through the DA interface 118 are equal to the control signals CONT_CH0 of the first channel region CH0. Since the data distribution circuit 450 operates in the first mode, the data DQ<0:3> of the data DQ<0:7> received through the DA interface 118 may be transferred to the data bus CH0_DQ<0:63> corresponding to the pseudo A channel region CH0_PCA, and the data DQ<4:7> of the data DQ<0:7> may be transferred to the data bus CH0_DQ<64:127> corresponding to the pseudo B channel region CH0_PCB.

The write command WTA1 indicating a write operation of the pseudo A channel region CH0_PCA may be applied by the control signals CONT_CH0 at time point 501. The write command WTB1 indicating a write operation of the pseudo B channel region CH0_PCB may be applied by the control signals CONT_CH0 at time point 502. The write command WTA2 indicating a write operation of the pseudo A channel region CH0_PCA may be applied at time point 503. The write command WTB2 indicating a write operation of the pseudo B channel region CH0_PCB may be applied at time point 504.

Data A1, A2, B1, B2, C1, C2, D1 and D2 corresponding to the write command WTA1 may be received through the DA interface 118 at time point 505 after the write latency WL from time point 501. At this time, the data A1, B1, C1 and D1 may correspond to DQ<0:3>, and the data A2, B2, C2 and D2 may correspond to DQ<4:7>. The data DQ<0:3>, i.e. the data A1, B1, C1 and D1 may be repeatedly copied at 1:16, and transferred to the data bus CH0_DQ<0:63> of the pseudo A channel region CH0_PCA. The data DQ<4:7>, i.e. the data A2, B2, C2 and D2 may be repeatedly copied at 1:16, and transferred to the data bus CH0_DQ<0:63> of the pseudo B channel region CH0_PCB. The data A1, B1, C1 and D1 written to the pseudo A channel region CH0_PCA by the write command WTA1 may be represented by WTA1_DATA.

Data C1, C2, D1, D2, E1, E2, F1 and F2 corresponding to the write command WTB1 may be received through the DA interface 118 at time point 506 after the write latency WL from time point 502. The data DQ<0:3>, i.e. the data C1, D1, E1 and F1 may be repeatedly copied at 1:16, and transferred to the data bus CH0_DQ<0:63> of the pseudo A channel region CH0_PCA. The data DQ<4:7>, i.e. the data C2, D2, E2 and F2 may be repeatedly copied at 1:16, and transferred to the data bus CH0_DQ<0:63> of the pseudo B channel region CH0_PCB. The data C2, D2, E2 and F2 written to the pseudo A channel region CH0_PCA by the write command WTB1 may be represented by WTB1_DATA.

In this way, the data WTA2_DATA written to the pseudo A channel region CH0_PCA by the write command WTA2 may correspond to data E1, F1, G1 and H1, and the data WTB2_DATA written to the pseudo B channel region CH0_PCB by the write command WTB2 may correspond to data G2, H2, I2 and J2, As illustrated in FIG. 5, the data distribution circuit 450 of FIG. 4 may differently distribute the data transferred to the pseudo A channel region CH0_PCA and the data transferred to the pseudo B channel region CH0_PCB. Therefore, the data written to the pseudo A channel region CH0_PCA and the data written to the pseudo B channel region CH0_PCB may have different patterns.

In accordance with the present embodiments, it is possible to increase the test efficiency of the memory device.

Although various embodiments have been described for illustrative purposes, it will be apparent to those skilled in the art that various changes and modifications may be made without departing from the spirit and scope of the invention as defined in the following claims.

What is claimed is:

1. A memory device comprising:
   a plurality of data pads;
   a data distribution circuit suitable for distributing data received through some data pads of the plurality of data pads to a first data bus, and distributing data received through other data pads to a second data bus, in a first mode;
   a first channel region suitable for storing data obtained by copying the data of the first data bus at a predetermined ratio of 1:N where N is an integer equal to or more than 2; and a second channel region suitable for storing data obtained by copying the data of the second data bus at the predetermined ratio of 1:N.

2. The memory device of claim 1, further comprising a plurality of control pads,
wherein the first and second channel regions are controlled by control signals received through the plurality of control pads.

3. The memory device of claim 1, wherein the data distribution circuit equally distributes data received by the plurality of data pads to the first and second data buses in a second mode.

4. The memory device of claim 1, wherein in the first mode, the data distribution circuit copies the data received through the some data pads at a ratio of 1:2 and distributes the copied data to the first data bus, while copying the data received through the other data pads at the ratio of 1:2 and distributing the copied data to the second data bus.

5. The memory device of claim 1, wherein in a third mode, the data distribution circuit distributes the data received through the some data pads to the first data bus, and inverts the data received through the some data pads and further distributes the inverted data to the first data bus, while distributing the data received through the other data pads to the second data bus, and inverting the data received through the other data pads and further distributing the inverted data to the second data bus.

6. The memory device of claim 1, wherein in a fourth mode, the data distribution circuit distributes the data received through the plurality of data pads to the first data bus, and inverts the data received through the plurality of data pads and distributes the inverted data to the second data bus.

7. The memory device of claim 1, wherein the memory device comprises a high bandwidth memory (HBM), and the plurality of data pads is included in a direct access (DA) interface.

8. A high bandwidth memory (HBM) device comprising:
a direct access (DA) interface comprising a plurality of data pads;
a data distribution circuit suitable for distributing data received through some data pads of the plurality of data pads to an A data bus, and distributing data received through other data pads to a B data bus, in a first mode; and
first to Mth channel regions,
wherein each of the first to Mth channel regions comprises:
a pseudo A channel region suitable for storing data obtained by copying the data of the A data bus at a predetermined ratio of 1:N where N is an integer equal to or more than 2; and
a pseudo B channel region suitable for storing data obtained by copying the data of the B data bus at the predetermined ratio of 1:N.

9. The HBM device of claim 8, wherein the DA interface comprises a plurality of control pads, and
the first to Mth channel regions are controlled by control signals received through the plurality of control pads.

10. The HBM device of claim 8, wherein the data distribution circuit equally distributes data received by the plurality of data pads to the A and B data buses in a second mode.

11. The HBM device of claim 8, wherein in the first mode, the data distribution circuit copies the data received through the some data pads at a ratio of 1:2 and distributes the copied data to the A data bus, while copying the data received through the other data pads at the ratio of 1:2 and distributing the copied data to the B data bus.

12. The HBM device of claim 8, wherein in a third mode, the data distribution circuit distributes the data received through the some data pads to the A data bus, and inverts the data received through the some data pads and further distributes the inverted data to the A data bus, while distributing the data received through the other data pads to the B data bus, and inverting the data received through the other data pads and further distributing the inverted data to the B data bus.

13. The HBM device of claim 8, wherein in a fourth mode, the data distribution circuit distributes the data received through the plurality of data pads to the A data bus, and inverts the data received through the plurality of data pads and distributes the inverted data to the B data bus.

14. The HBM device of claim 8, further comprising:
a first copy circuit suitable for copying the data of the A data bus at a ratio of 1:N, and transferring the copied data to the pseudo A channel region; and
a second copy circuit suitable for copying the data of the B data bus at the ratio of 1:N, and transferring the copied data to the pseudo B channel region.

15. The HBM device of claim 8, wherein N is 8.

16. The HBM device of claim 8, further comprising:
a base die; and
a plurality of core dies,
wherein the DA interface and the data distribution circuit are included in the base die, and
the first to Mth channel regions are included in the plurality of core dies.

17. A memory device comprising:
an interface including a data pad configured to receive first data having a first size;
a plurality of channel regions, each channel region including a first region and a second region configured to store second data having a second size greater than the first size;
a data distribution circuit configured to receive the first data from the interface, and transfer the first data or the inverted first data as a first bus data and a second bus data to a first data bus and a second data bus, respectively;
a first copy circuit configured to receive and copy the first bus data to output the copied first bus data to the first region of each of the plurality of channel regions; and
a second copy circuit configured to receive and copy the second bus data to output the copied second bus data to the second region of each of the plurality of channel regions.

\* \* \* \* \*